US006680990B1

(12) United States Patent
Yoshida et al.

(10) Patent No.: US 6,680,990 B1
(45) Date of Patent: Jan. 20, 2004

(54) ELASTIC INTEGRATED CIRCUIT

(75) Inventors: Yoshikazu Yoshida, Tokyo (JP); Akira Yoshida, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/578,698

(22) Filed: May 26, 2000

(30) Foreign Application Priority Data

May 28, 1999 (JP) .......................................... 11-149958

(51) Int. Cl.[7] ............................................... H04L 25/40
(52) U.S. Cl. ........................ 375/372; 327/160; 327/161; 711/155
(58) Field of Search ................................ 375/354, 371, 375/372; 327/160, 161, 162, 141; 711/1, 100, 154, 155, 167, 168

(56) References Cited

U.S. PATENT DOCUMENTS 4,054,747 A * 10/1977 Pachynski, Jr. ............. 375/372
4,175,287 A * 11/1979 Fuhrman .................... 711/201
4,323,790 A     4/1982 Dunning et al.
4,596,026 A     6/1986 Cease et al.
5,996,052 A * 11/1999 Taniguchi et al. .......... 711/155

* cited by examiner

*Primary Examiner*—Stephen Chin
*Assistant Examiner*—Dac V. Ha
(74) *Attorney, Agent, or Firm*—Rabin & Berdo, P.C.

(57) ABSTRACT

The present invention provides a simple smaller-sized elastic integrated circuit having a lower power, to which data synchronized with a first clock is input and which outputs data synchronized with a second clock. The elastic integrated circuit includes a read address counter which operates with an internal clock to output a read address count value; a delay circuit to which the read address count value is input and which delays and outputs the read address count value by a predetermined time period; a write address counter which operates using the read address count value output from the delay circuit with a clock externally input so as to output a write address count value; and a memory circuit which writes data input thereto by the write address count value and reads data written therein by the read address count value.

4 Claims, 6 Drawing Sheets

ELASTIC INTEGRATED CIRCUIT

CROSS REFERENCE TO RELATED APPLICATIONS

This application claims the priority of Japanese application Serial No. 149958/1999 filed May 28, 1999, the subject matter of which is incorporated herein by reference.

BACKGROUND OF THE INVENTION

1. Field of the Invention

The present invention relates to an elastic integrated circuit including a simple elastic circuit to which data synchronized with the first clock is input, and from which data synchronized with the second clock is output.

2. Description of Related Art

A typical large scale integrated circuit such as a system LSI typically uses a clock tree circuit constituted by buffers, in order to supply a received clock to a logic circuit. The logic circuit processes data received thereby in the clock tree circuit using the clock supplied via the multiple staged buffer. In this case, if the number of the stages of buffer in the clock tree circuit is large and therefore the delay therein exceeds a half of the clock period, the phase relationship between the clock input to the clock tree circuit and the clock output therefrom is regarded as being uncertain in the circuit design. Thus, it is necessary to provide an elastic circuit in order to allow the data to be received and transmitted between the above clocks.

FIG. 6 shows a structure of an integrated circuit including a conventional elastic circuit.

As shown in FIG. 6, the elastic circuit 5 includes a memory circuit 51, a write address counter 52 and a read address counter 53.

To the write address counter 52, a clock is input via a clock terminal 21 before being input to a clock tree circuit 61. To a clock input C of the read address counter 53, a clock C0 to be used in a logic circuit 7, that is supplied via multiple stages of buffer in the clock tree circuit 60, is input. To the logic circuit 7 is input the clocks C0 and C1 via clock input terminals 41 and 42, respectively.

In a writing operation, a memory area in the memory circuit 51 into which input data is to be stored is specified by the count value of the write address counter 52, so that the input data input from an input terminal 1 is stored. In a reading operation, a memory region in the memory circuit 51 from which data is to be read is specified by the count value of the read address counter 53, so that the data stored in the specified memory area is read and is then input to the logic circuit 7 via an output terminal 3. Thus, data having a phase synchronized with the clocks C0 and C1 supplied from the multiple-stage buffers in the clock tree circuit 60 is input to the logic circuit 7.

The conventional circuit, however, has a problem where it is necessary to use a counter having a base number of four or more and a memory having four or more regions. FIG. 7 is a time chart in a case of using the conventional elastic circuit where a ternary (base three) counter is used. Referring to FIG. 7, the reason why the counter of the base number of four or more and the memory requires four or more regions in the circuit shown in FIG. 6 is described.

Herein, it is assumed that two count values are set to zero by an asynchronous reset signal having a one-bit width, which is externally input via the reset input terminal 22 in FIG. 6. In this case, the count value of the write address counter 52 is set to zero at a time tw1. This means that the reset signal is input between a time indicated by a solid line and a time indicated by a broken line (i.e., a period having about a two-bit width) in FIG. 7.

In this case, the count value of the read address counter 53 is also set to zero by the reset signal. However, the phase of the clock input to the read address counter 53 is not determined unlike the clock input to the write address counter 52. Thus, the read address counter 53 is reset at a certain rising between a time tr1 and a time tr2.

Consideration is then made of which count value of the read address counter #0 written in the memory circuit 51 is read, in a case where the write address count value is zero. #0 cannot be read out when the counter values of both the read address counter 53 and the write address counter 52 are zero. At a count value of the read address counter 53 of one, that is, when "a read address counter ①" is used, the count value of the read address counter 53 is set to zero at the time tr1 of the input clock. Thus, times of writing and reading operations are critical and therefore #0 cannot be read out confidently. At a count value of the read address counter 53 of two, that is, when the read address counter ②" is used, next data is written into the memory circuit 51 at the time tr2 at which the count value of the writing address counter 52 is set to zero. Therefore, it is hard to read #0 confidently.

Therefore, the conventional circuit requires the counter having the base number of four or more in order to read #0 confidently when the read address counter 53 has the count value of two. (It should be noted that the capacity of the memory circuit 51 has to be increased in proportion to the base number of the counter.)

SUMMARY OF THE INVENTION

It is thus an object of the present invention to overcome the above issues of the conventional circuit and to provide an integrated circuit having a smaller area and a low power, to which data synchronized with the first clock is input and which outputs data synchronized with the second clock. This object is achieved by combinations described in the independent claims. The dependent claims define further advantageous and exemplary combinations of the present invention.

According to an aspect of the present invention, an elastic integrated circuit to which data synchronized with a first clock is input and which outputs data synchronized with a second clock, is provided. The elastic integrated circuit includes: a base-(N+1) read address counter operating with the second clock to output a read address count value, where N is a natural number; a delay circuit to which the read address count value is input and which delays the read address count value by a predetermined time period to be output; a base-(N+1) write address counter to which the read address count value output from the delay circuit is loaded to be input and which operates with the first clock to output a write address count value; and a memory circuit into which input data is written by the write address count value and from which data written therein is read by the read address count value.

In one embodiment of the present invention, the delay circuit is a shift register including a plurality of flip-flops, in which each of the flip-flops operates with an operation clock having a phase delayed from that for another flip-flop connected thereafter.

In another embodiment of the present invention, the elastic circuit further includes a clock tree circuit in which S buffers are connected in series, where S is a natural number. Each of the S buffers has a delay smaller than one clock period. The first clock is input to the clock tree circuit that outputs the second clock having a total delay that is (N−1) clock periods or more but less than N clock periods, where N is a natural number.

In still another embodiment of the present invention, the delay circuit includes a plurality of flip-flops, and each of the flip-flops operates with an operation clock having a phase delayed from that for another flip-flop connected thereafter. The delay circuit operates by using the output of a predetermined one of the S buffers as an operation clock thereof.

This summary of the invention does not necessarily describe all necessary features so that the invention may also be a sub-combination of these described features.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

The invention will now be described based on preferred embodiments, which do not intend to limit the scope of the present invention, but rather to exemplify the invention. All of the features and the combinations thereof described in the embodiments are not necessarily essential to the invention.

Figure 1:
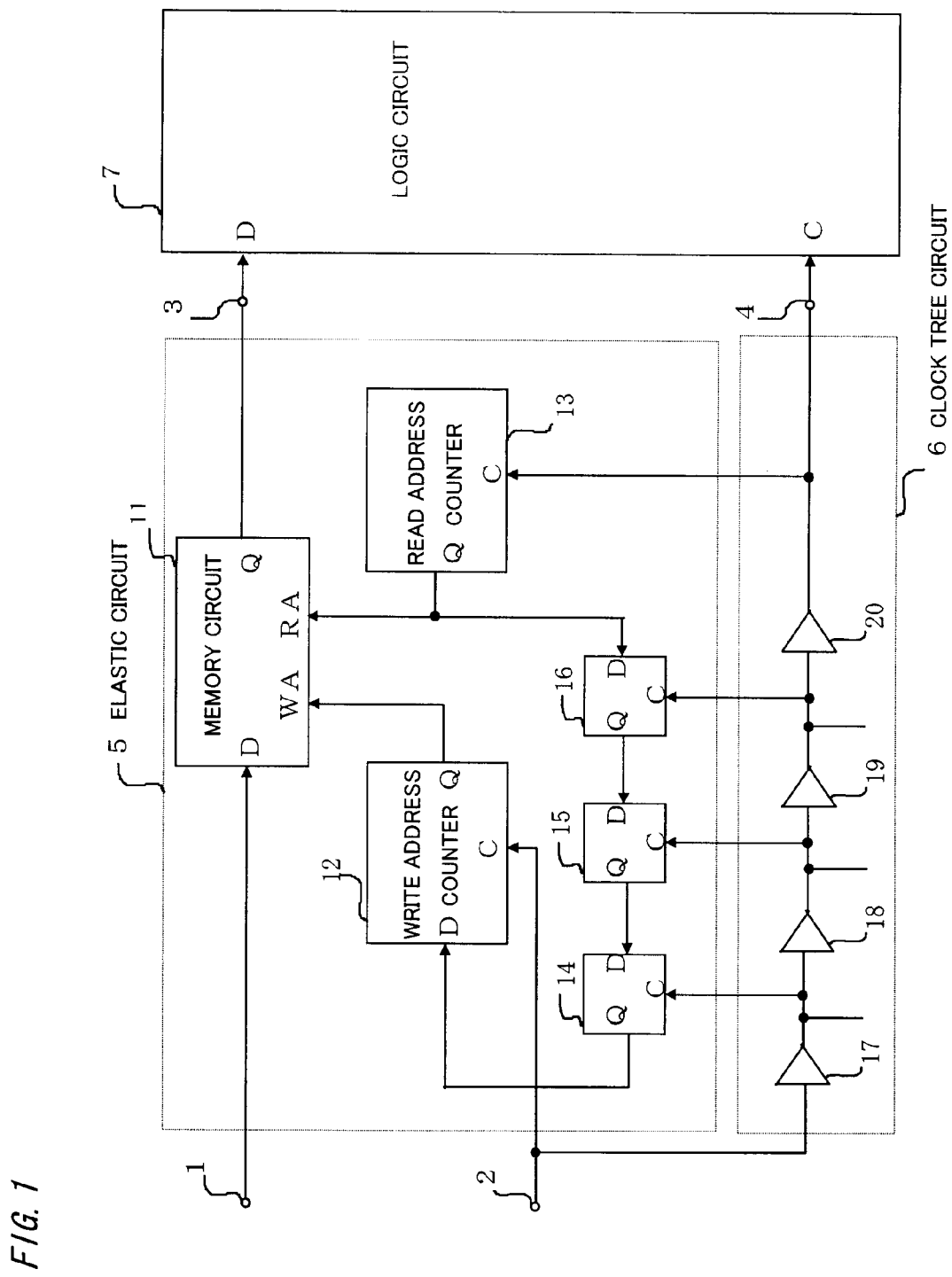
FIG. 1 is a block diagram for explaining an integrated circuit according to an embodiment of the present invention.

FIG. 1 is a block diagram for explaining an integrated circuit according to an embodiment of the present invention. The integrated circuit of the present embodiment is described below, referring to FIG. 1.

In FIG. 1, 1 denotes a data input terminal; 2 denotes an external clock input terminal; 3 denotes a data output terminal via which data is output from an elastic circuit 5; 4 denotes a clock output terminal via which a clock is supplied from a clock tree circuit 6; 7 denotes a logic circuit; 11 denotes a memory circuit; 12 denotes a write address counter; 13 denotes a read address counter; 14, 15 and 16 denote data flip-flops (hereinafter, simply referred to as D-FFs); and 17, 18, 19 and 20 denote buffers. Each of the above-listed components is implemented by a conventional element, such as a conventional memory circuit, a conventional address counter or a conventional flip-flop.

The data input terminal 1 is connected to a data input D of the memory circuit 11. An output Q of the memory circuit 11 is connected to the data output terminal 3, which in turn is connected to a data input D of the logic circuit 7. The external clock input terminal 2 is connected to a clock input C of the write address counter 12 and an input of the buffer 17 in the clock tree circuit 6. An output Q of the write address counter 12 is connected to a write address input WA of the memory circuit 11.

An output Q of the read address counter 13 is connected to a read address input RA of the memory circuit 11 and an input D of the D-FF 16. An output Q of the D-FF 16 is connected to an input D of the D-FF 15 having an output Q connected to an input D of the D-FF 14. An output Q of the D-FF 14 is connected to a data input D of the write address counter 12. To clock inputs D of the D-FFs 14, 15 and 16, outputs of the buffers 17, 18 and 19 are respectively connected. In the clock tree circuit 6, the buffers 17, 18, 19 and 20 are connected in series in that order. An output of the buffer 20 is connected to a clock input C of the read address counter 13 and the clock output terminal 4. The clock output terminal 4 is connected to a clock input C of the logic circuit 7.

Figure 2:
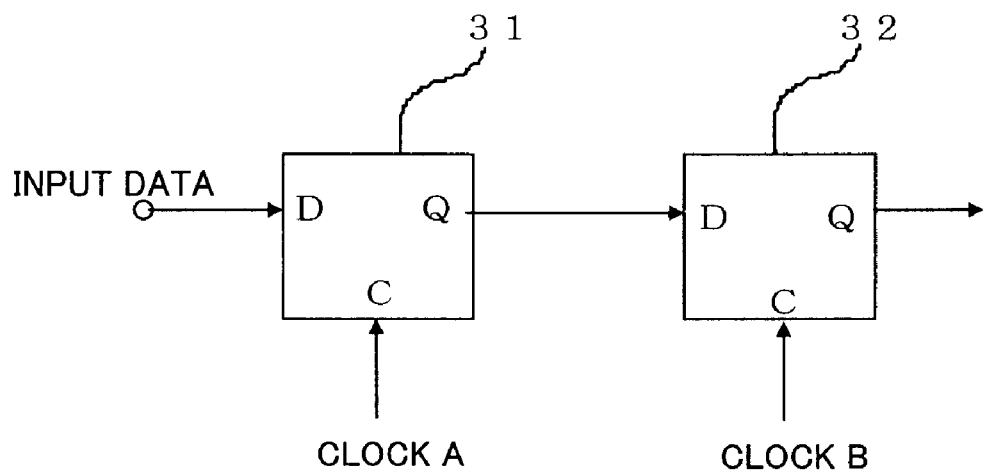
FIG. 2 is a block diagram for explaining an operation principle of the integrated circuit shown in FIG. 1.
Figure 3:
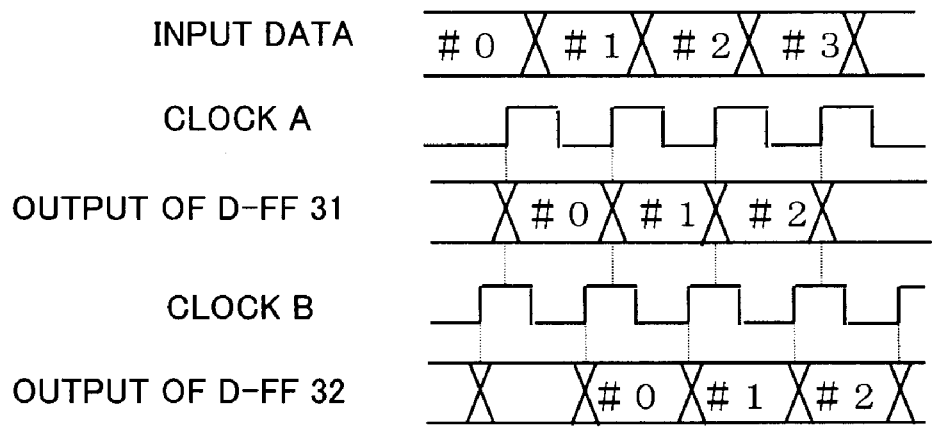
FIG. 3 is a time chart of the integrated circuit shown in FIG. 2.

FIG. 2 is a block diagram for explaining the operation principle; and FIG. 3 is a time chart thereof. Referring to FIGS. 2 and 3, the operation principle is described below.

In a circuit in which two D-FFs 31 and 32 are connected in series as shown in FIG. 2, the D-FF 32 can confidently latch output data of the D-FF 31 in a case where a clock B input to the latter D-FF 32 is in advance from a clock A input to the former D-FF 31 by a phase sufficiently smaller than one period (for example, equal to a delay in one stage of the buffer), as shown in FIG. 3.

The relationship between the D-FFs 31 and 32 in FIG. 2 correspond to those between the read address counter 13 and the D-FF 16, between the D-FFs 16 and 15, between the D-FFs 15 and 14 and between the D-FF 14 and the write address counter 12 in FIG. 1, and the latter circuit can thus confidently latch the output data of the former one. In other words, the count value of the read address counter 13 can be confidently transmitted to the write address counter 12.

Figure 4A:
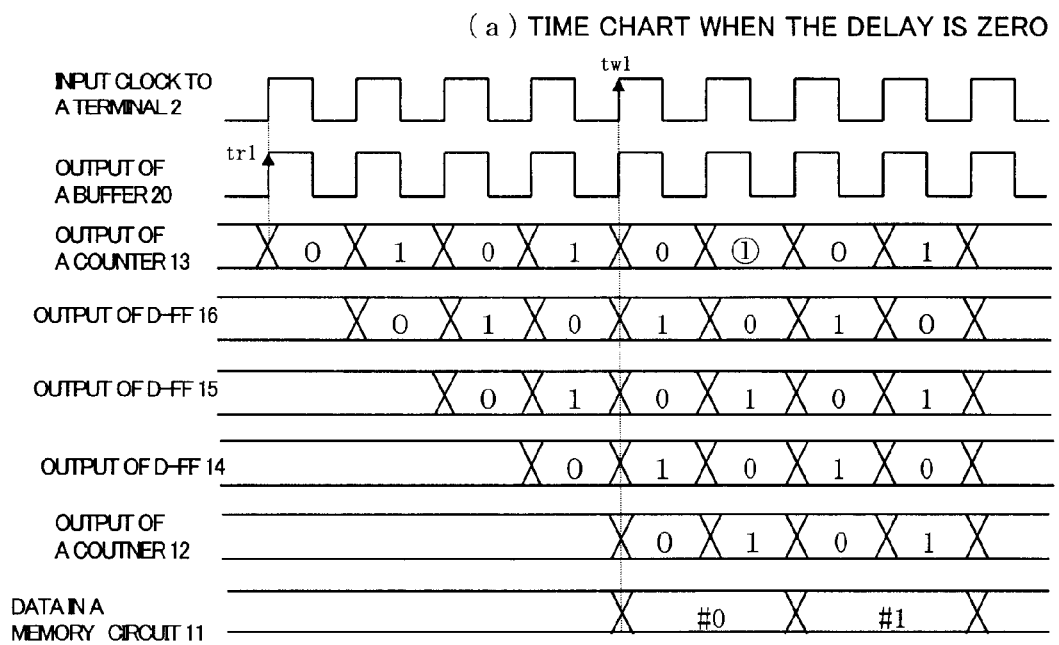
FIGS. 4A and 4B are time charts of the integrated circuit shown in FIG. 1 in a case where a binary counter is used and a maximum delay in a clock tree circuit 6 is less than one period.
Figure 4B:
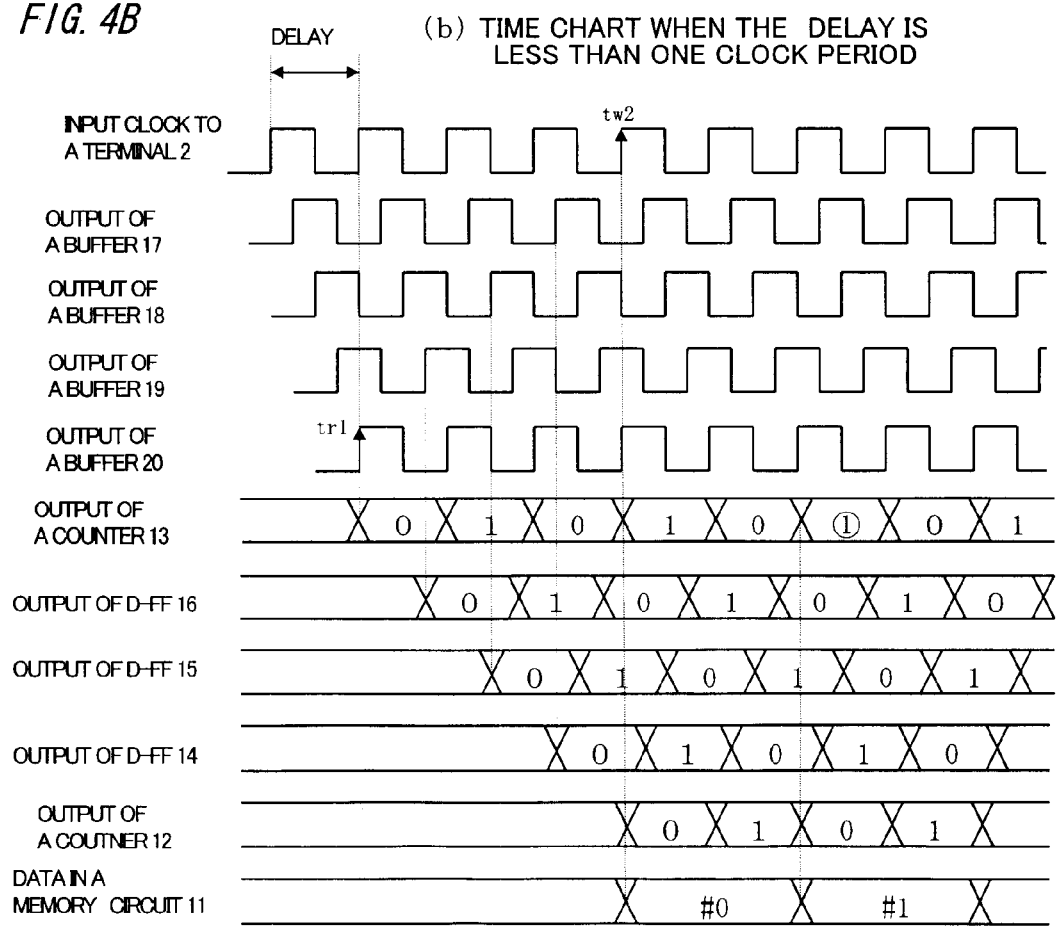

In a case where the maximum delay in the clock tree circuit 6 is less than one period of the clock in FIG. 1, the write address counter 12 and the read address counter 13 can be implemented by binary counters. FIGS. 4A and 4B are time charts, in a case where the counters 12 and 13 are implemented by the binary counters when the delay in the clock tree circuit 6 is zero and when it is less than one clock period, respectively. The following description is made referring to FIGS. 4A and 4B.

As shown in FIGS. 4A and 4B, the count value of the read address counter 13 becomes zero at a rising edge tr1 of the clock output by the buffer 20 in the clock tree circuit 6. In the case of no delay in the clock tree circuit 6 (i.e., a delay of zero) shown in FIG. 4A, the count value of the write address counter 12 becomes zero at a rising edge tw1 of the clock input to the input terminal 2. The output of the write address counter 12 is delayed from that of the read address counter 13 by four bits since the output of the read address counter 13 is input to the write address counter 12 via the three D-FFs.

In the case where the delay in the clock tree circuit 6 is the maximum delay (less than one clock period), as shown in FIG. 4B, the count value of the write address counter 12 becomes zero at a rising edge tw2 of the clock input to the input terminal 2. In this case, the outputs of the two counters become closer by one clock period (i.e., one bit). In other words, the output of the write address counter 12 is delayed from that of the read address counter 13 by three bits.

Thus, if the data, that has been written in the memory circuit when the count value of the write address counter 12 is zero, is read when the count value of the read address counter 13 is one (indicated with ① in FIGS. 4A and 4B), the data can be read steadily in the case of the delay of zero as shown in FIG. 4A. This is because there is a time difference, which is about one clock period, between the time of data writing and the time of data reading. Also in the case of the maximum delay as shown in FIG. 4B, the data can be read steadily because the data reading occurs slightly before the time of data writing (i.e., before the data in the memory circuit 11 is changed from #0 to #1).

Figure 5A:
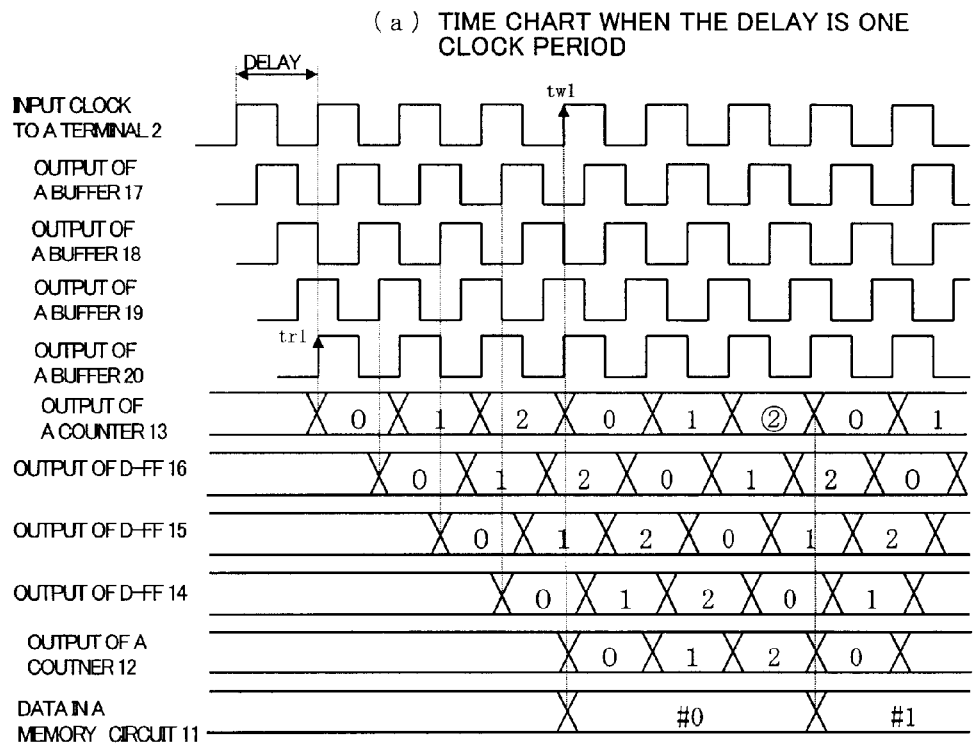
FIGS. 5A and 5B are time charts of the integrated circuit shown in FIG. 1 in a case where a ternary counter is used and a maximum delay in the clock tree circuit 6 is one period or more but is less than two periods.
Figure 5B:
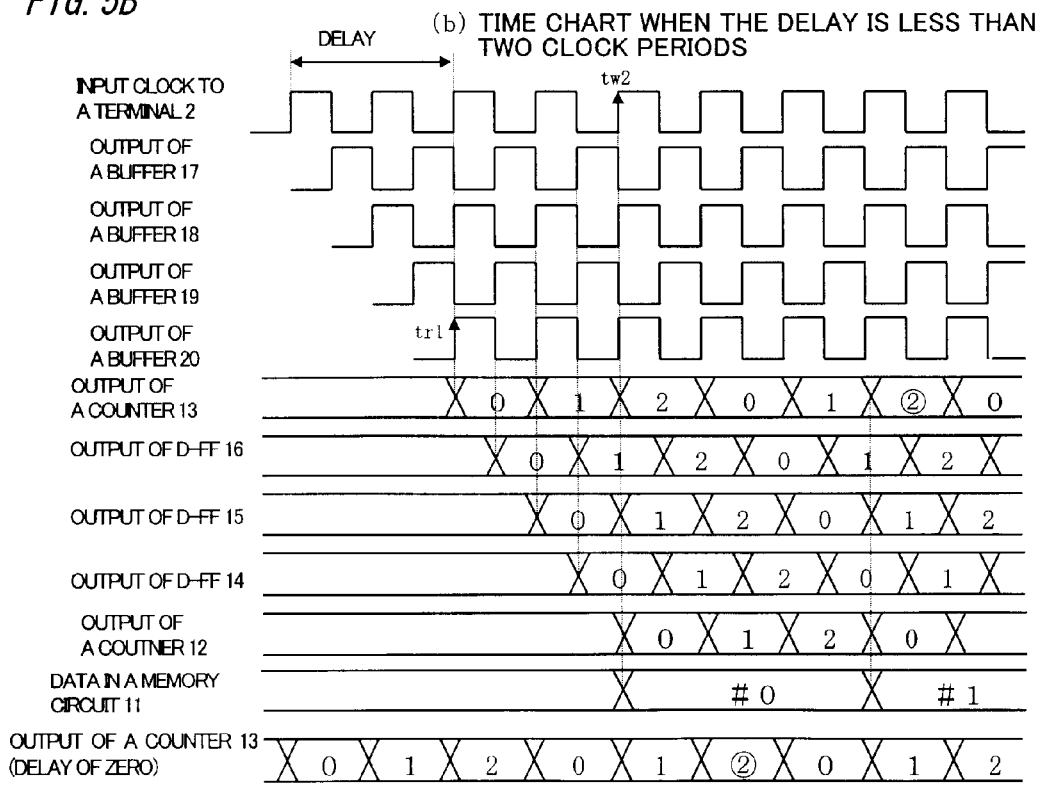
Figure 6:
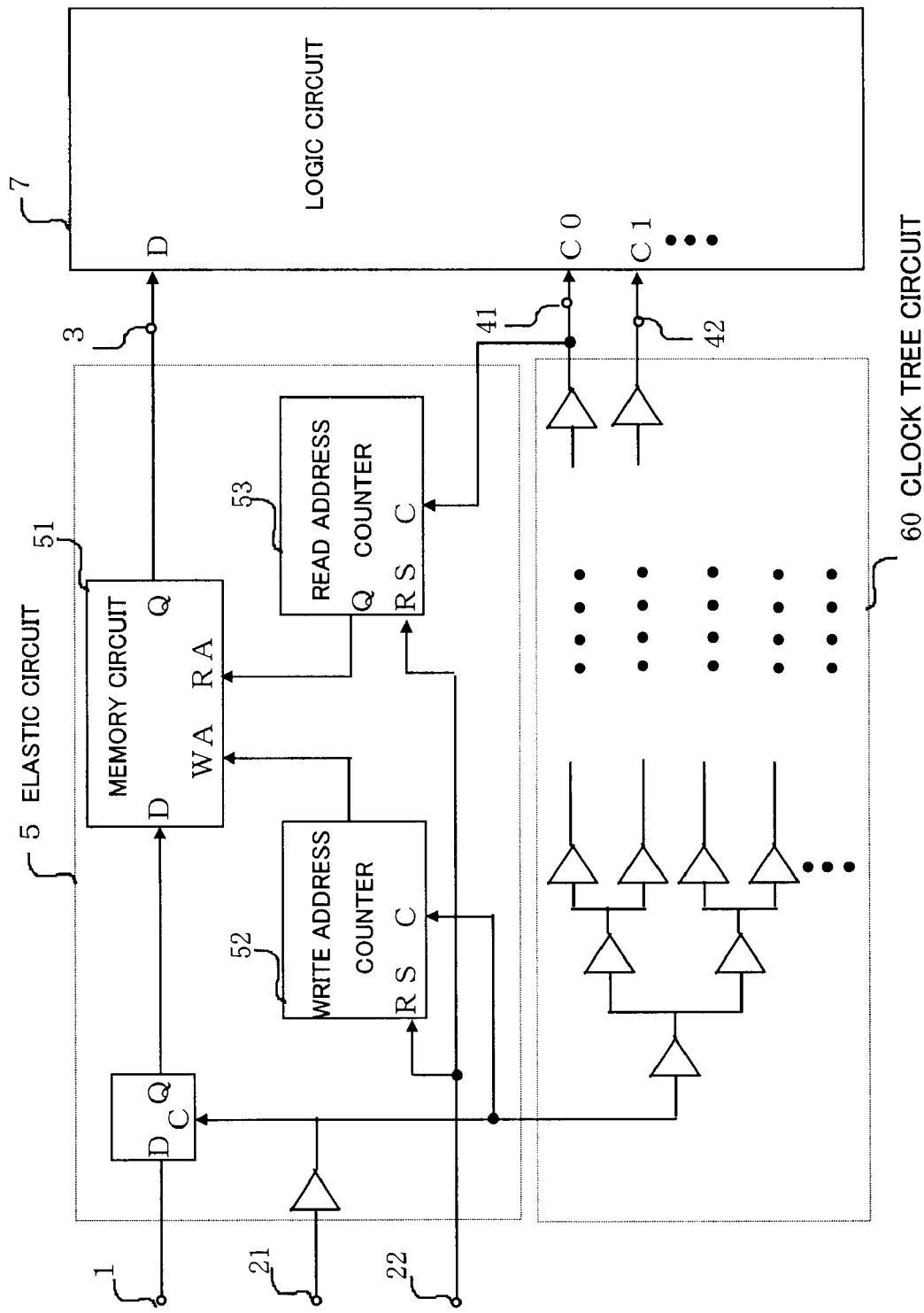
FIG. 6 is a block diagram of an integrated circuit including the conventional elastic circuit.
Figure 7:
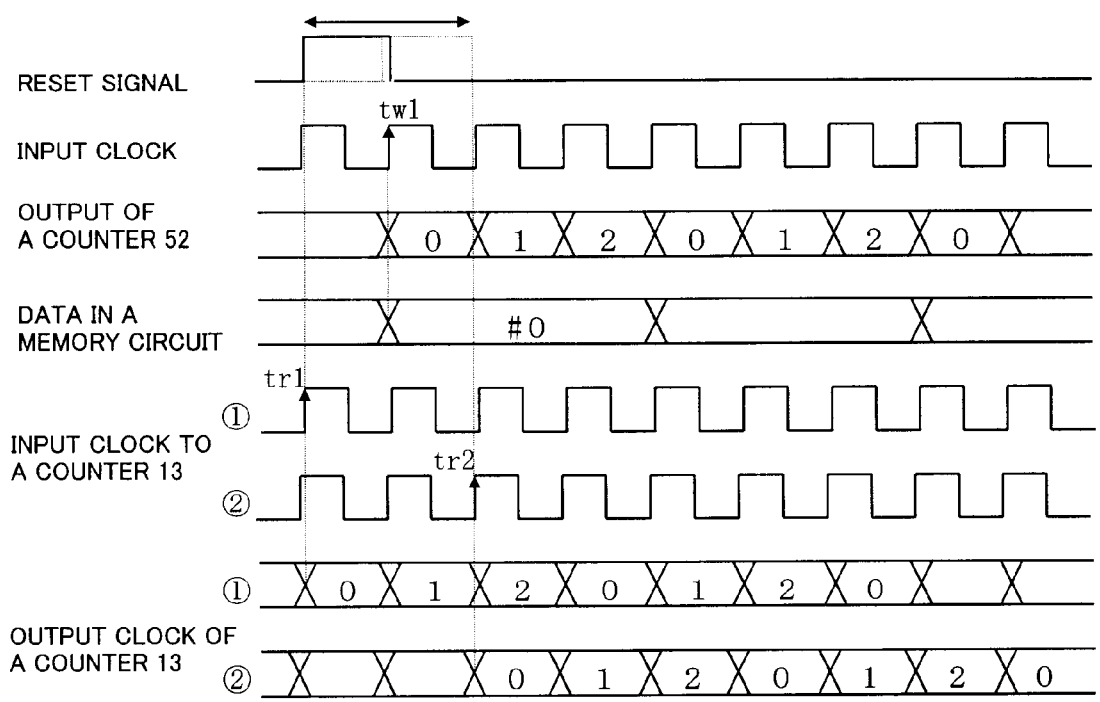
FIG. 7 is a time chart of the integrated circuit shown in FIG. 6.

When the maximum delay in the clock tree circuit 6 is one clock period or more but less than two clock periods in FIG. 1, the write address counter 12 and the read address counter 13 can be implemented by ternary (base three) counters. FIGS. 5A and 5B are time charts, when the counters 12 and 13 are implemented by the ternary counters, in a case where the delay in the clock. tree circuit 6 is one clock period and another case where it is less than two clock periods. The following description is made referring to FIGS. 5A and 5B.

As shown in FIGS. 5A and 5B, the count value of the read address counter 13 becomes zero at the rising edge tr1 of the clock output by the buffer 20 in the clock tree circuit 6. In the case of the minimum delay (i.e., one clock period) in the clock tree circuit 6 as shown in FIG. 5A, the count value of the write address counter 12 becomes zero at the rising edge tw1 of the clock input to the input terminal 2. In the case of the maximum delay (i.e., less than two clock periods) as shown in FIG. 5B, the count value of the write address counter 12 becomes zero at tw2.

Thus, if the data that was written in the memory circuit 11 when the count value of the write address counter 12 was zero is read when the count value of the read address counter 13 is two (indicated with ② in FIGS. 5A and 5B), the data #0 can be read steadily both in the case of the minimum delay and the maximum delay. This is because there is a time difference between the data writing time and the data reading time that is equal to about one clock in the case of the minimum delay; or because the data #0 is read slightly before the data writing time (i.e., before the data in the memory circuit 11 is changed #0 to #1). Please note that the data can also read steadily in the case where the delay is less than one clock period.

As described above, the elastic circuit can be constituted by a base-(N+1) write address counter and a base-(N+1) read address counter, when the maximum delay in the clock tree circuit 6 is (N−1) clock periods or more but less than N clock periods, where N is a natural number.

As described above, according to the present embodiment, the output of the read address counter 13 is loaded to the write address counter 12 with a predetermined delay amount. Thus, the phase difference between the external clock input to the input terminal 2 and the internal clock delayed by the clock tree circuit 6 can be absorbed. Moreover, a delay circuit for providing the predetermined delay amount is constituted by the D-FFs 14, 15 and 16, and the outputs from the buffers 17, 18 and 19 connected in series are used as the operation clocks for the D-FFs 14, 15 and 16. Therefore, the phase of the operation clock input to the former D-FF is delayed from that input to the latter D-FF, and thus the data can be latched to be output confidently.

In the present embodiment, a description is made for a case in which four buffers are provided in the clock tree circuit 6 and three D-FFs are provided in the elastic circuit. However, the structure is not limited to the above. A delay circuit for providing a predetermined delay amount corresponding to the clock period, for example, which has the structure including (M−1) (M is natural number) or less D-FFs when M buffers are provided, can operate in the same manner. Also, the same operation can be effected by designing the times in such a manner that the address value of the write address counter 12 is N when that of the read address counter 13 is zero.

As described above in detail, according to the present invention, in the elastic circuit to which the data synchronized with the first clock corresponding to the external clock is input and which outputs the data synchronized with the second clock serving as the internal clock that is distributed into the internal logic circuit included therein, the output of the read address counter is delayed by a predetermined time period and is then loaded to be input to the write address counter. Thus, an elastic circuit can be realized with the counter having the minimum base number and the minimum-capacity memory without the reset signal being input externally, thereby a smaller-sized integrated circuit having a lower power can be realized.

Although the present invention has been described by way of exemplary embodiments, it should be understood that many changes and substitutions may be made by those skilled in the art without departing from the spirit and the scope of the present invention which is defined only by the appended claims.

What is claimed is:

1. An elastic integrated circuit to which data synchronized with a first clock is input and which outputs data synchronized with a second clock, comprising:
    a base-(N+1) read address counter operating with the second clock to output a read address count value, where N is a natural number;
    a delay circuit to which the read address count value is input and which delays the read address count value by a predetermined time period to be output;
    a base-(N+1) write address counter to which the read address count value output from the delay circuit is loaded to be input and which operates with the first clock to output a write address count value; and
    a memory circuit into which input data is written by the write address count value and from which data written therein is read by the read address count value.

2. An elastic circuit according to claim 1, wherein the delay circuit is a shift register including a plurality of flip-flops in which each of the flip-flops operates with an operation clock having a phase delayed from that for another flip-flop connected thereafter.

3. An elastic circuit according to claim 1, further comprising a clock tree circuit in which S buffers are connected in series where S is a natural number, each of the S buffers having a delay smaller than one clock period,
    wherein the first clock is input to the clock tree circuit that outputs the second clock having a total delay that is (N−1) clock periods or more but less than N clock periods, where N is a natural number.

4. An elastic integrated circuit according to claim 3, wherein the delay circuit includes a plurality of flip-flops, each of the flip-flops operating with an operation clock having a phase delayed from that for another flip-flop connected thereafter, and
    wherein the delay circuit operates by using the output of a predetermined one of the S buffers as an operation clock thereof.

* * * * *